US008395451B2

(12) United States Patent
Logue

(10) Patent No.: US 8,395,451 B2
(45) Date of Patent: Mar. 12, 2013

(54) LOW 1/F NOISE HIGH-FREQUENCY BROADBAND AMPLIFIER (DC-12 GHZ)

(76) Inventor: Mark Scott Logue, Portland, OR (US)

(*) Notice: Subject to any disclaimer, the term of this patent is extended or adjusted under 35 U.S.C. 154(b) by 1 day.

(21) Appl. No.: 12/931,027

(22) Filed: Jan. 20, 2011

(65) Prior Publication Data
US 2012/0188021 A1    Jul. 26, 2012

(51) Int. Cl.
   *H03F 3/16* (2006.01)
(52) U.S. Cl. .................... 330/300; 330/311; 330/252
(58) Field of Classification Search .................. 330/300, 330/311, 252
   See application file for complete search history.

(56) References Cited

U.S. PATENT DOCUMENTS

| | | | |
|---|---|---|---|
| 4,284,959 A * | 8/1981 | Heagerty et al. | 330/253 |
| 5,748,040 A * | 5/1998 | Leung | 330/253 |
| 7,595,627 B1 * | 9/2009 | Mahnke et al. | 323/316 |
| 7,737,789 B2 * | 6/2010 | Eisenstadt et al. | 330/311 |
| 7,741,910 B2 * | 6/2010 | Wong | 330/260 |
| 7,948,809 B2 * | 5/2011 | Miki | 365/189.09 |

* cited by examiner

*Primary Examiner* — Patricia Nguyen

(57) ABSTRACT

A N-Channel HJ-FET cascode amplifier, with a High Frequency NPN Transistor differential error amplifier, having low 1/f noise, a DC to 12 GHz bandwidth, flat frequency response, excellent transient response, high linearity, and low input and output VSWR over a wide frequency range.

6 Claims, 7 Drawing Sheets

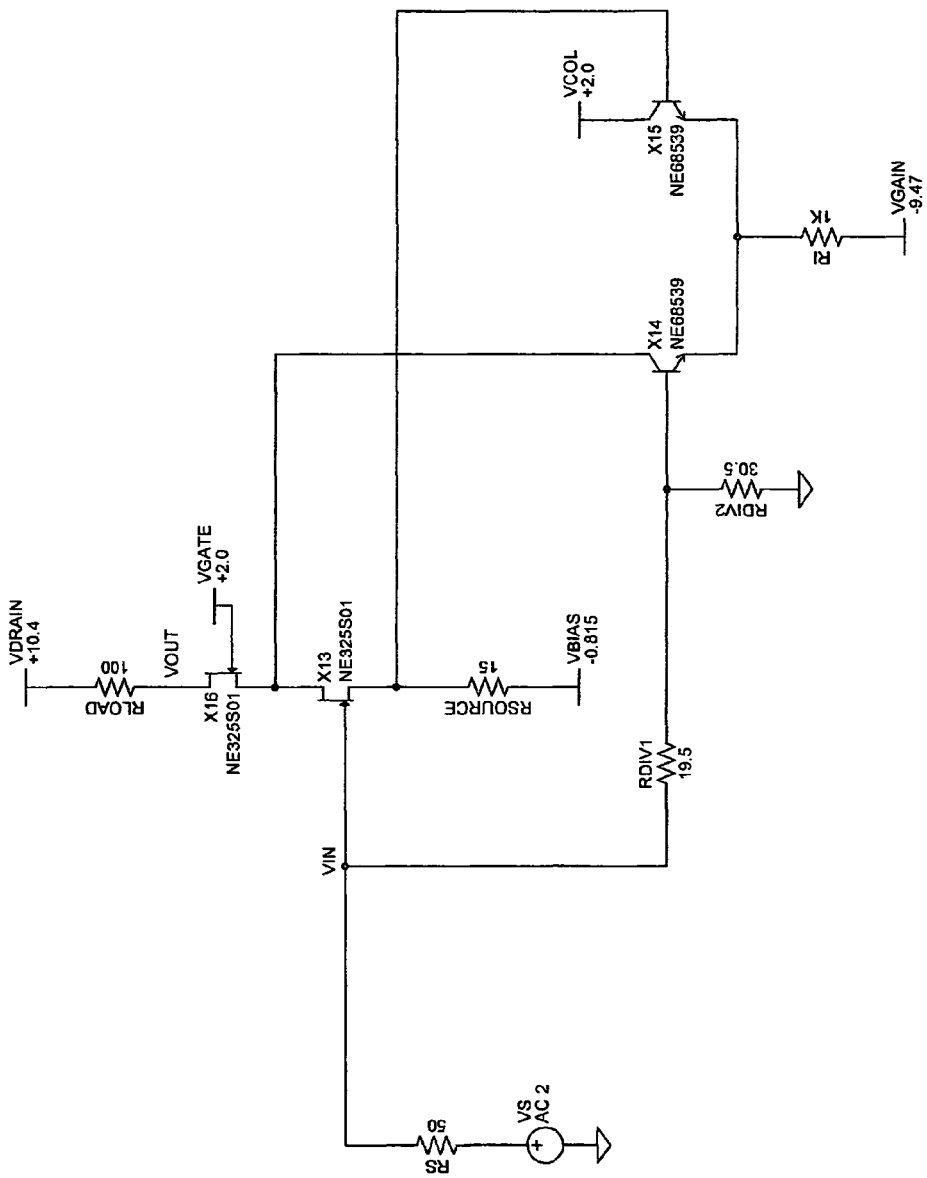

LOW 1/F NOISE HIGH-FREQUENCY BROADBAND AMPLIFIER (DC-12 GHZ)

This invention was first filled Jan. 21, 2010, application No. 61/336,369 by myself, Mark Scott Logue, I wish to claim benefit.

BACKGROUND OF THE INVENTION

Field of the Invention

The subject invention relates to electronic amplifiers, and more particularly, to a low 1/f noise, high-frequency broadband design, employing amplifier elements.

SUMMARY OF THE INVENTION

Accordingly, it is an object of the invention to improve microwave and broad-band amplifiers;

It is another object of the invention to improve broad-band and microwave amplifiers employing N-Channel HJ-FETs and;

It is another object of the invention to provide a high-frequency amplifier design which exhibits low 1/f noise, high linearity, excellent transient response, flat frequency response, low input and output VSWR over a wide frequency range, and DC to 12 GHz bandwidth.

These and other objects and advantages are achieved according to the invention by provision of a cascode FET stage with a high $f_T$ bipolar differential transconductance error amplifier. The input signal is seen as a common-mode signal to the error amplifier, whereas the error signal component, taken-off the first FET source in the cascode, is seen as a differential signal. The error signal consists of 1/f noise, and harmonic distortion of the amplifier.

The transcondance error amplifier provides an error signal current which is summed into the source of the second FET of the cascode. This approach results in a 20-30 dB reduction in 1/f noise seen at the output.

In conclusion: The design yields an amplifier with low 1/f noise, high linearity, a DC to 12 GHz bandwidth with flat frequency response, and excellent transient response with a 23.9 ps risetime.

BRIEF DESCRIPTION OF THE DRAWINGS

The foregoing features of this invention, as well as the invention itself, may be more fully understood from the following description of the drawing in which:

FIG. 7 is a schematic circuit diagram of the preferred embodiment of the invention;

DETAILED DESCRIPTION OF THE PREFERRED EMBODIMENT

FIG. 7 illustrates a low 1/f noise amplifier employing FETs and bipolar transistors in accordance with the preferred embodiment of the invention. The amplifier includes two FETs forming a cascode, with two bipolar transistors forming the differential pair transconductance error amplifier. RDIV1 and RIV2 form a voltage divider for one input to the differential pair transconductance error amplifier. The SOURCE of the first FET of the cascode is the second input to the error amplifier. The sum of RDIV1 and RDIV2 is the input resistance of the amplifier. RLOAD÷RSOURCE to the first order, sets the gain of the cascode, and RLOAD is the output resistance of the amplifier. The value of VGAIN, a voltage supply sets the gain of the error amplifier by controlling the standing current of the differential pair.

The main amplifier has two active devices; X13 and X16. Both devices have three terminals comprising a GATE, DRAIN and SOURCE. Both devices are a N-Channel HJ-FETs part number NE325SO1 as manufactured by California Eastern Laboratories NEC Corporation.

The error amplifier has two active devices; X14 and X15. Both devices have three terminals comprising a BASE, COLLECTOR and EMITTER. Both devices are a NPN Silicon High Frequency Transistor part number NE68539 as manufactured by California Eastern Laboratories NEC Corporation.

The Input Source VS is connected at one terminal to signal GRD and the second terminal to the first terminal of RS, the second terminal of RS is connected to the Gate of X13. The first terminal of RDIV1 is connected to the Gate of X13. The second terminal of RDIV1 is connected to the first terminal of RDIV2, and connected to the BASE of X14. The second terminal of RDIV2 is connected to signal GRD. The EMITTER of X14 is connected to the EMITTER of X15 and one terminal of RI. The COLLECTOR of X14 is connected to the DRAIN of X13 and the SOURCE of X16. The second terminal of RI is connected to VGAIN a voltage source shown in FIG. 7. The COLLECTOR of X15 is connected to VCOL a voltage source shown in FIG. 7. The base of X15 is connected to the SOURCE of X13 and the second terminal of RSOURCE. The first terminal of RSOURCE is connected to VBIAS a voltage source shown in FIG. 7. The GATE of X16 is connected to VGATE a voltage source shown in FIG. 7. The DRAIN of X16 is connected to the first terminal of RLOAD. The second terminal of RLOAD is connected to VDRAIN a voltage source shown in FIG. 7.

The amplifier INPUT is the GATE of X13. The amplifier OUTPUT is the DRAIN of X16.

Figure 1:
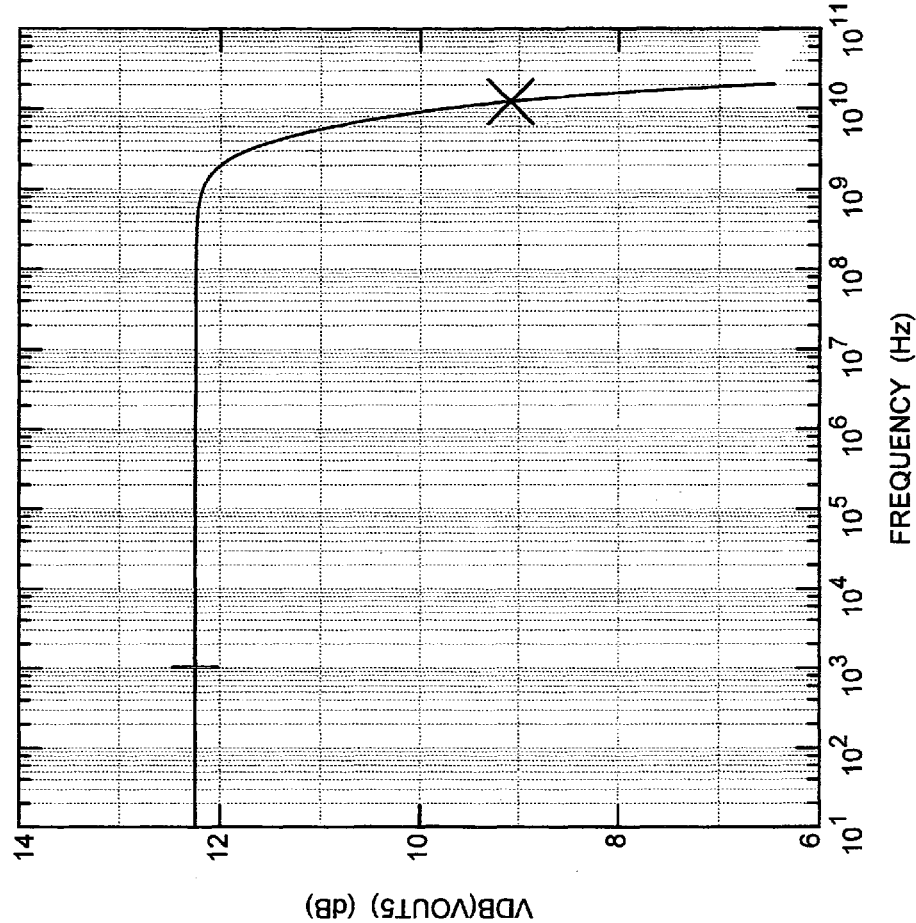
FIG. 1 is a plot of the Frequency Response (dB) of the amplifier.

FIG. 1 illustrates a plot of the Frequency Response (dB) of the amplifier design. The frequency response plot shows a gain of 12.2 dB at 1 kHz. The gain drops to 12.0 dB at 2 GHz. The gain is flat within 0.24 dB from 1 kHz to 2 GHz. At 12.3 GHz the gain drops by 3.1 dB showing a 12.3 GHz bandwidth.

Figure 2:
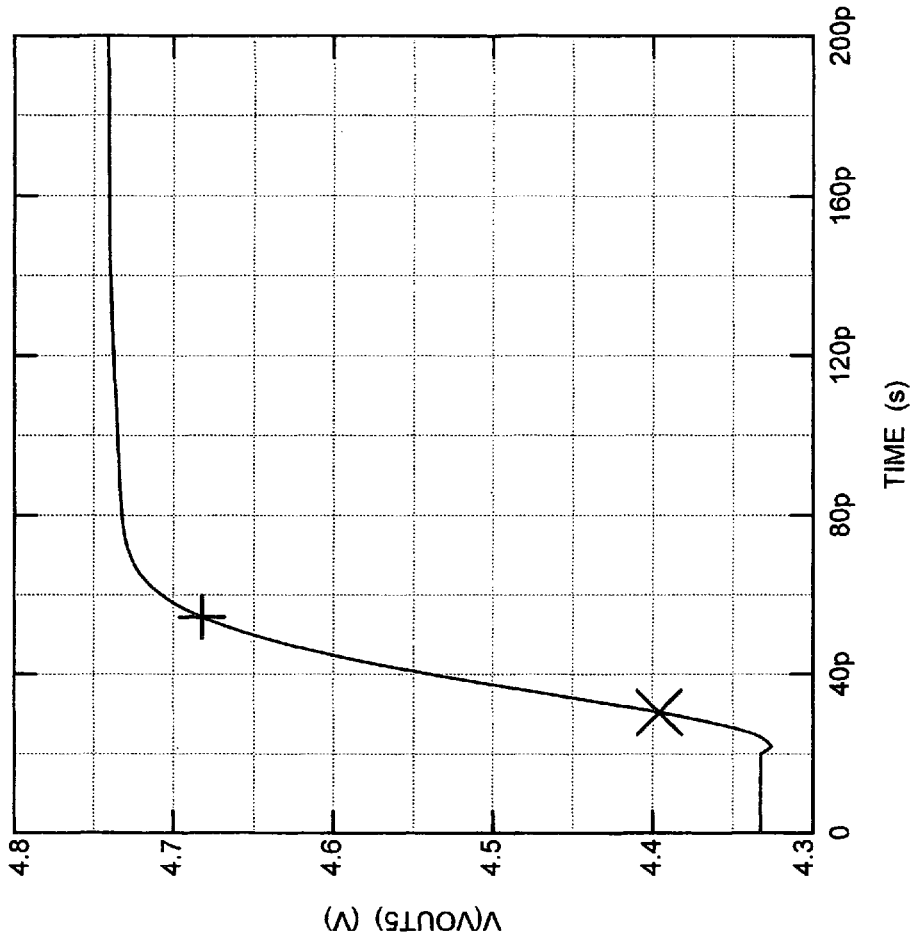
FIG. 2 is a plot of the Transient Response of the amplifier.

FIG. 2 illustrates a plot of the Transient Response of the amplifier design. The amplifier has excellent transient response with no over-shoot. The risetime shown on the plot is 23.9 ps.

Figure 3:
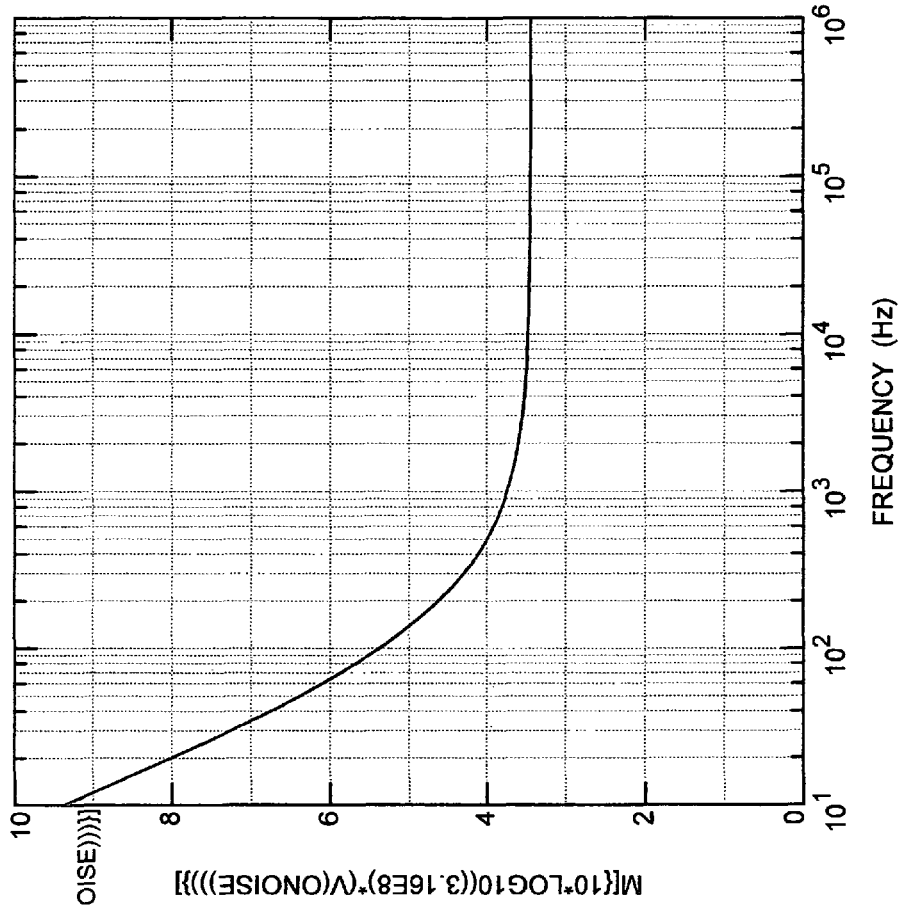
FIG. 3 is a plot of the Noise Figure versus Frequency of the amplifier.

FIG. 3 illustrates a plot of the Noise Figure versus Frequency of the amplifier design. FIG. 3 is a plot of the low frequency noise figure. The noise figure is 9.3 dB at 10 Hz where the 1/f noise is dominant. The noise figure decreases to 5.3 dB at 100 Hz, 3.8 dB at 1 kHz, and 3.5 dB at 10 kHz.

Figure 4:
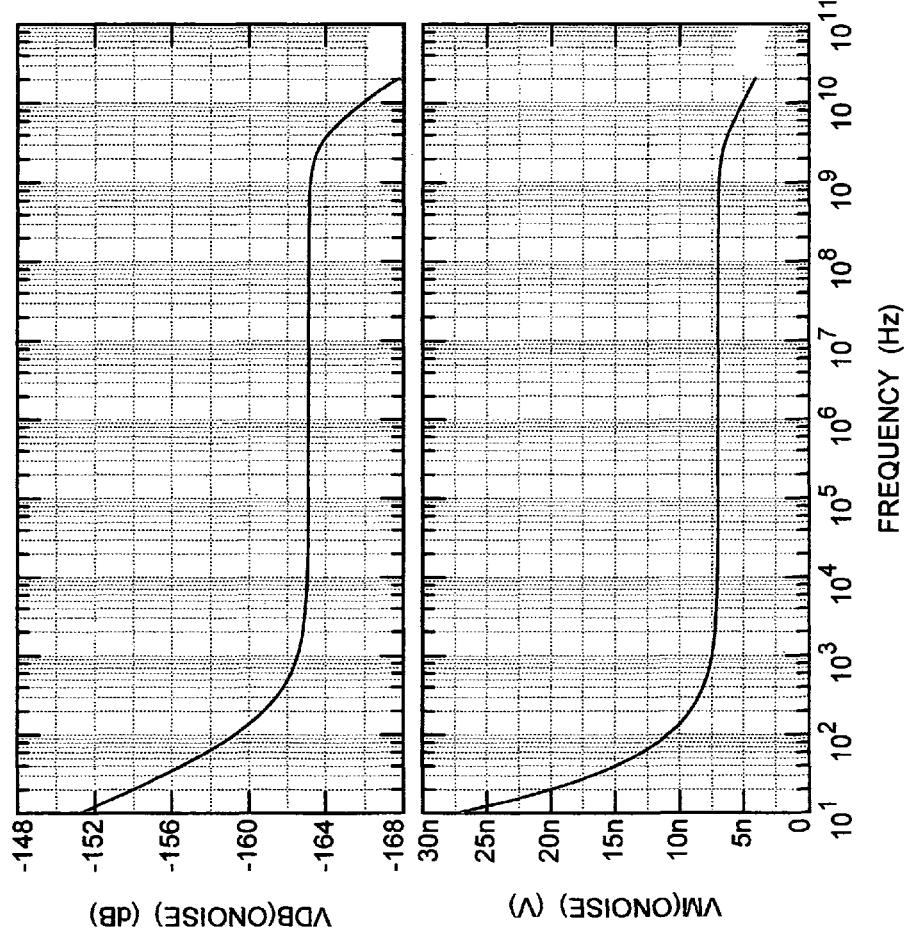
FIG. 4 are plots of the Output Noise versus Frequency of the amplifier.

FIG. 4 illustrates are plot of the Output Noise versus Frequency of the amplifier design. FIG. 4 is two plots of the output noise in dB and VRMS per $\sqrt{Hz}$ of bandwidth obtained from TopSpice™. The output noise is the total noise from ALL sources. At 10 Hz the output noise is −151.2 dB or 27.4 nV RMS per $\sqrt{Hz}$, at 100 Hz the output noise is −159.2 dB or 11.0 nV RMS per Hz, at 1 kHz the output noise is −162.5 dB or 7.5 nV RMS per $\sqrt{Hz}$, and at 10 kHz the output noise is −163.1 dB or 7.0 nV RMS per $\sqrt{Hz}$.

Figure 5:
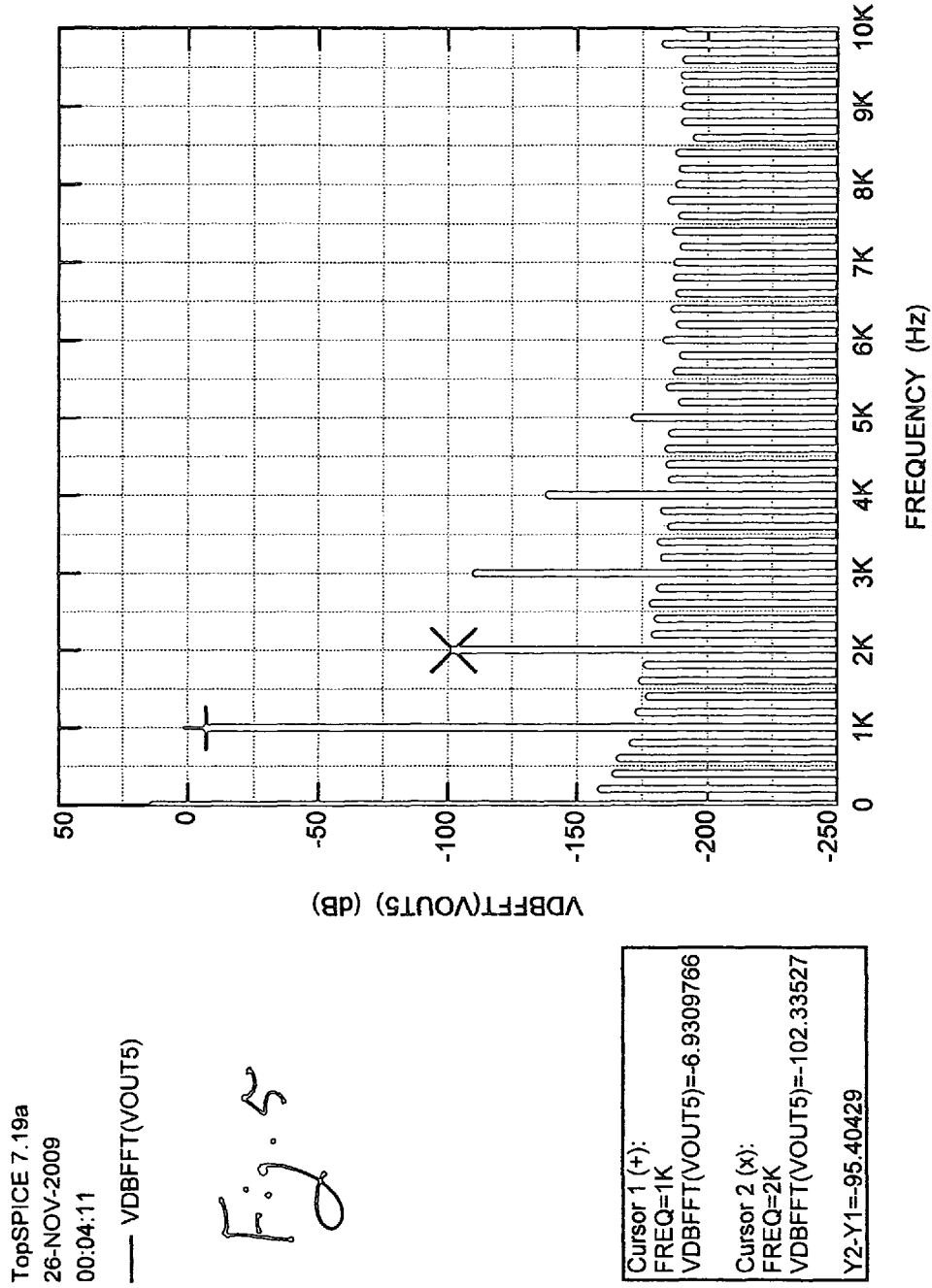
FIG. 5 is a FFT of the Output Signal given a 1 kHz Input Signal.

FIG. 5 illustrates is a FFT of the Output Signal given a 1 kHz Input Signal. FIG. 5 is a FFT of the output, given a 1 kHz input with a −6.9 dB output level. The second harmonic distortion is shown to be 95.4 dB down from the fundamental.

Figure 6:
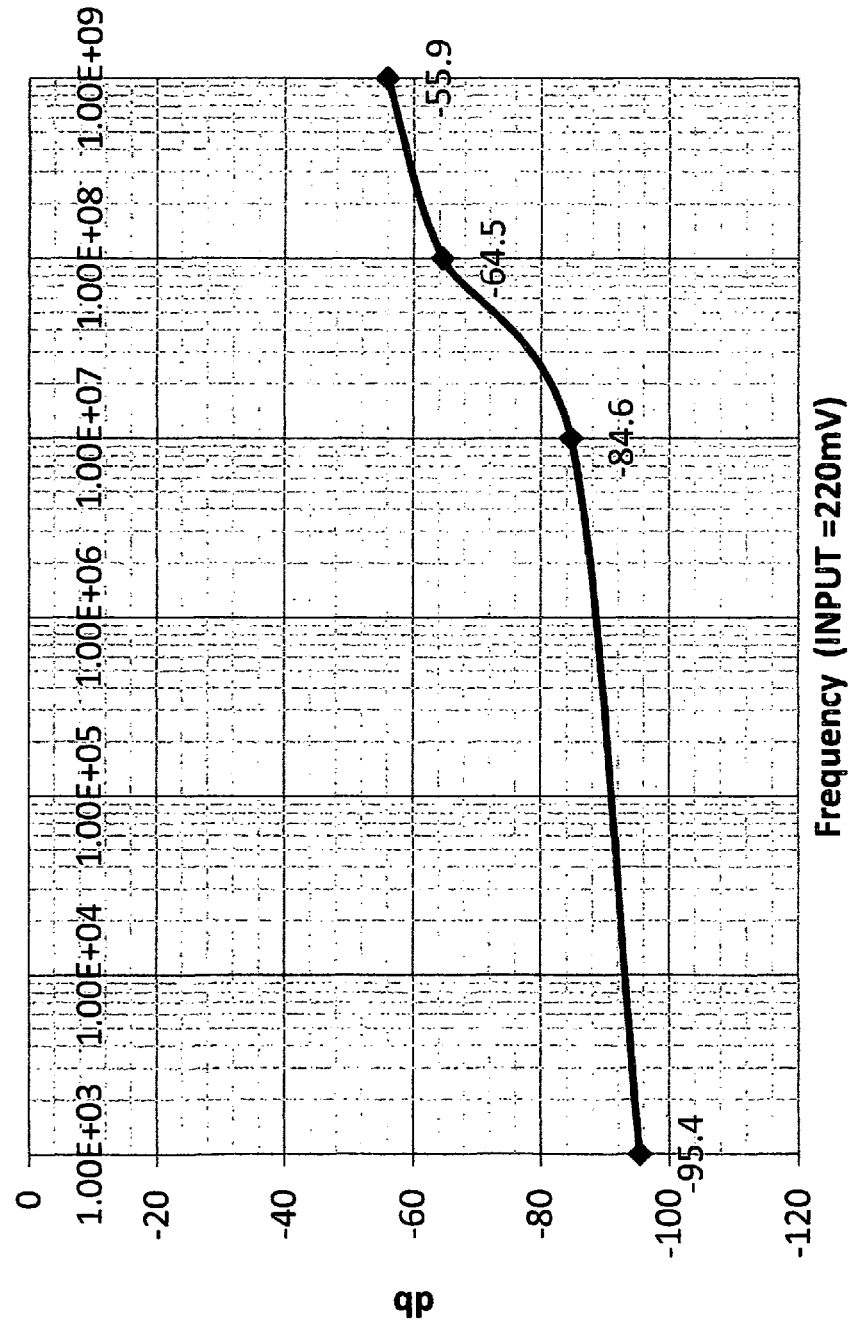
FIG. 6 is a curve of the $2^{nd}$ Harmonic Distortion (dB) versus Frequency of the Input.

FIG. 6 illustrates a curve of the $2^{nd}$ Harmonic Distortion (dB) versus Frequency of the Input. FIG. 6 is a plot $2^{nd}$ harmonic distortion versus input frequency from 1 kHz to 1 GHz. The curve shows the break point to be 10 MHz where the output distortion begins a steep rise. The output distortion for a 1 kHz input is −95.4 dB, the output distortion for a 10 MHz input is −84.6 dB, the output distortion for a 100 MHz input is −64.5 dB, and the output distortion for a 1 GHz input is −55.9 dB.

The amplifier consists of two parts; the main gain cell and an error amplifier. The gain cell consists of two N-Channel HJ-FETs, while the error amplifier consists of the two 12 GHz $f_T$ NPN Silicon High Frequency transistors.

The gain cell is a cascode that provides high bandwidth, and a "summing node". The "summing node" has two current inputs; first, the main signal current and second a signal current produced by the differential transconductance error amplifier.

The input divider consisting of RDIV1 and RDIV2 attenuates the input signal and provides 50Ω input impedance. The sum:

RDIV1+RDIV2=50Ω and the ratio of:

$$\frac{RDIV2}{RDIV1 + RDIV2}$$

is set to provide a signal at the base of X14 equal to the low frequency signal at the base of X15. Thus, the input signal is seen as a common-mode signal to the error amplifier, thus producing little signal current at the collector of X14.

The "error signal" is seen at the source of X13. The major components of the "error signal" consists of 1/f noise, and harmonic distortion produced by the gain cell. The signal current produced as a result of the "error signal" which appears at the output of X13 is:

$$\frac{ERROR\ SIGNAL}{RSOURCE}$$

The signal current produced by the error amplifier is:

ERRORSIGNAL×$g_m$ where $g_m$ is the transconductance of the error amplifier. The $g_m$ is set by the standing current of the differential pair of the error amplifier. VGAIN is adjusted to produce minimum levels of 1/f noise at the amplifier output.

The differential signal is the attenuated input signal seen at the base of X14 minus the attenuated input signal plus the error signal seen at the base of X15. Therefore, the differential signal seen by the error amplifier is the error signal alone.

The input impedance at the base of X14 of the error amplifier is high given the input signal is seen as a common-mode signal to the error amplifier, given both bases of the error amplifier have the same input signal. The standing current in the error amplifier is set low relative to the standing current of the gain cell to lower the 1/f noise of the error amplifier relative to the 1/f noise of the gain cell. The 1/f noise corner of the bipolar transistors are <<lower than the 1/f noise corner of the N-Channel HJ-FETs. These factors cause the 1/f noise of X13 to be the dominate noise source at low frequencies.

The plots shown are a result of computer simulation from the software licensed to the Inventor or his company, Logue Consulting of Portland, Oregon, by TopSpice™ of Penzar Development, P.O. Box 10358, Canoga Park, Calif. 91309 USA.

I claim:

1. An single-ended amplifier DC-coupled both at input and output, comprising N-Channel HJ-FETs and high-frequency NPN transistors for operating broadband in the microwave frequency range, said FET has a drain, gate and source, said NPN transistor has a collector, base, and emitter, and a cascode amplifier consisting of two N-Channel HJ-FETs forming the main amplifier, and two high frequency NPN transistors forming a differential error amplifier.

2. An input stage according to claim 1, said amplifier element further comprising: a broadband input termination consisting of two resistors connected in series, forming a broadband voltage divider connected to the first input of the error amplifier.

3. An input stage according to claim 2, said amplifier element further comprising: a source terminal of the input FET, connected to the second input of the error amplifier, containing the error signal.

4. An input stage according to claim 3, said amplifier element further comprising: a broadband load and output termination connected to the drain terminal of the output FET of the cascode.

5. An error amplifier according to claim 1, said amplifier element further comprising: two high frequency NPN transistors with variable gain set by a DC power supply connected to the resistor common to both emitter terminals of the error amplifier.

6. An error amplifier according to claim 5, said amplifier element further comprising: a current summing node located at the drain terminal of the input FET of the cascode and the source terminal of the second FET of the cascode, which sums the signal current of the input FET and the error current of the collector terminal of the error amplifier.

* * * * *